United States Patent [19]

Matsumoto

[11] Patent Number: 4,733,286
[45] Date of Patent: Mar. 22, 1988

[54] SEMICONDUCTOR PHOTOELECTRIC CONVERTING DEVICE

[75] Inventor: Kazuya Matsumoto, Ina, Japan

[73] Assignee: Olympus Optical Co., Ltd., Japan

[21] Appl. No.: 62,417

[22] Filed: Jun. 16, 1987

Related U.S. Application Data

[63] Continuation of Ser. No. 946,099, Dec. 23, 1986, abandoned, which is a continuation of Ser. No. 686,847, Dec. 27, 1984, abandoned.

[30] Foreign Application Priority Data

Dec. 28, 1983 [JP]  Japan ............................. 58-245059

[51] Int. Cl.$^4$ ..................... H01L 27/14; H01L 29/80
[52] U.S. Cl. ......................................... 357/30; 357/22; 357/23.1; 357/47
[58] Field of Search ............... 357/30, 22, 23.1, 47, 357/41, 23.11; 358/212, 213, 241

[56] References Cited

U.S. PATENT DOCUMENTS

| | | | |
|---|---|---|---|
| 4,241,358 | 12/1980 | Wade | 357/30 |
| 4,333,224 | 6/1982 | Buchanan | 357/22 |
| 4,377,817 | 3/1983 | Nishizawa et al. | 357/22 |
| 4,381,517 | 4/1983 | Harada | 357/30 |
| 4,485,392 | 11/1984 | Singer | 357/22 |

FOREIGN PATENT DOCUMENTS

0072471 7/1978 Japan ..................................... 357/23
0166965 12/1980 Japan ..................................... 357/22

OTHER PUBLICATIONS

"Static Induction Transistor Image Sensors"; IEEE Transactions on Electron Devices, vol. ED-26, No. 12, Dec. 1979.
Japan Annual Reviews in Electronics, Computers & Telecommunications, "Semiconductor Technologies"; 1982, Editor J. Nishizawa.

*Primary Examiner*—James W. Davie
*Assistant Examiner*—Georgia Y. Epps
*Attorney, Agent, or Firm*—Parkhurst & Oliff

[57] ABSTRACT

A semiconductor photoelectric converting device for use in a solid state image sensor includes an insulating substrate, an n$^-$ epitaxial layer formed on the substrate, n$^+$ source and drain regions formed by diffusing n type impurities into the surface of the epitaxial layer, a p$^+$ gate region formed by diffusing p type impurities into the surface of epitaxial layer between the source and drain regions, and an n$^-$ channel region formed between the source and drain regions. Photocarriers induced in the channel region are stored in the gate region and a source-drain current having an amplitude corresponding to an amount of stored photocarriers flows through the channel region in parallel with the surface of the epitaxial layer. Thus the photoelectric converting device is formed by a lateral type static induction transistor.

11 Claims, 8 Drawing Figures

FIG_2A
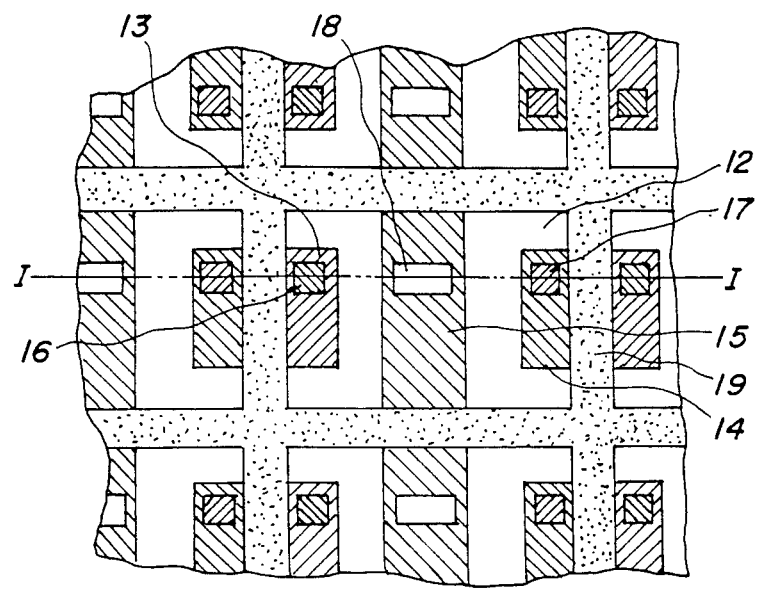
FIG_2B
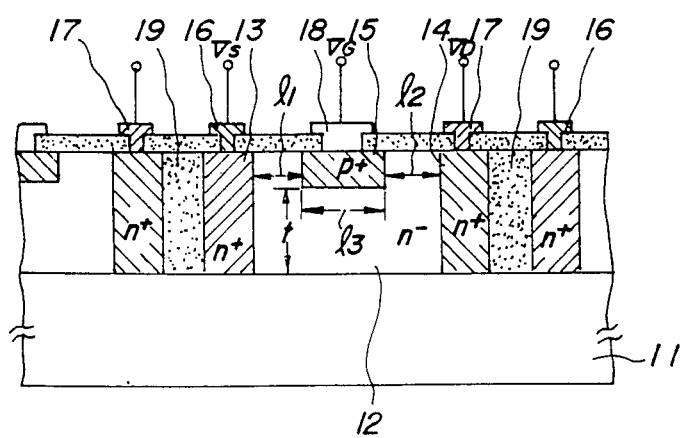

FIG_3A
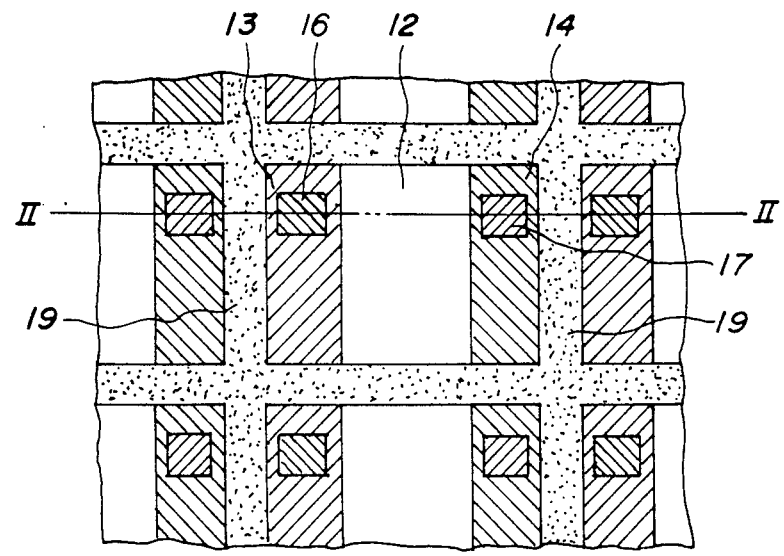
FIG_3B
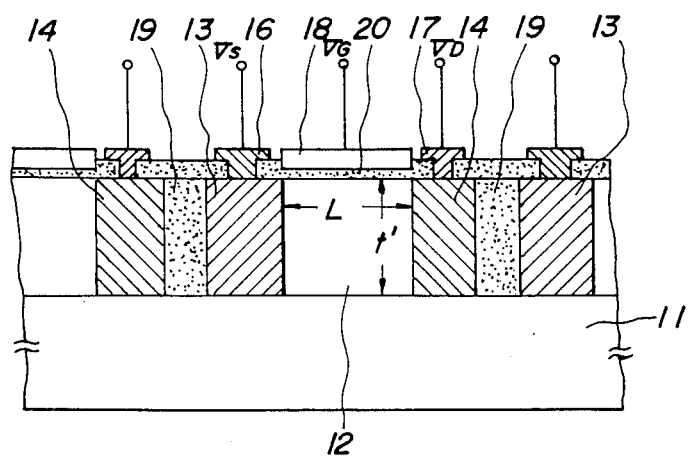

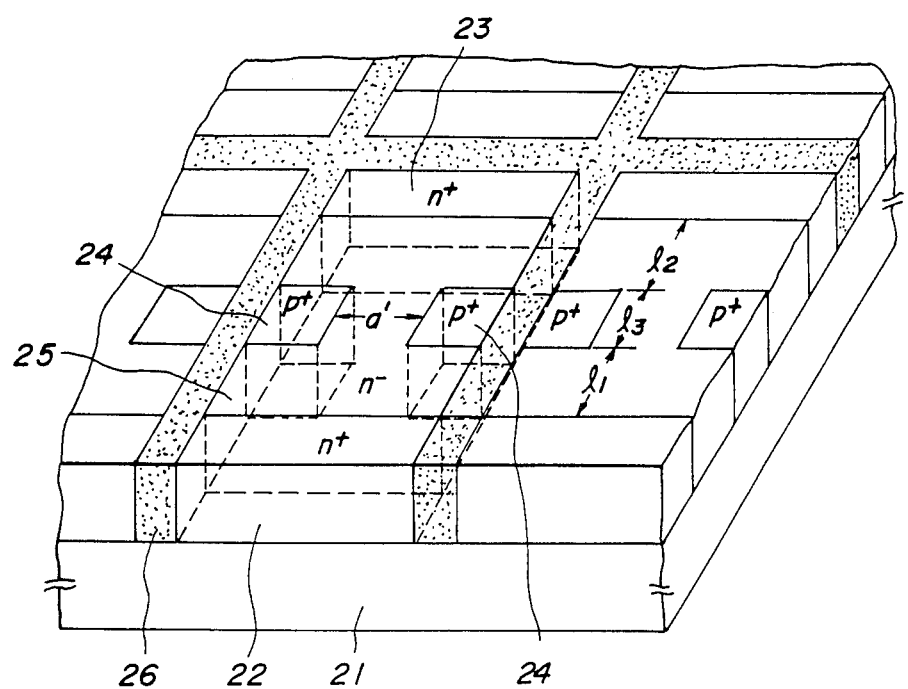
FIG_5

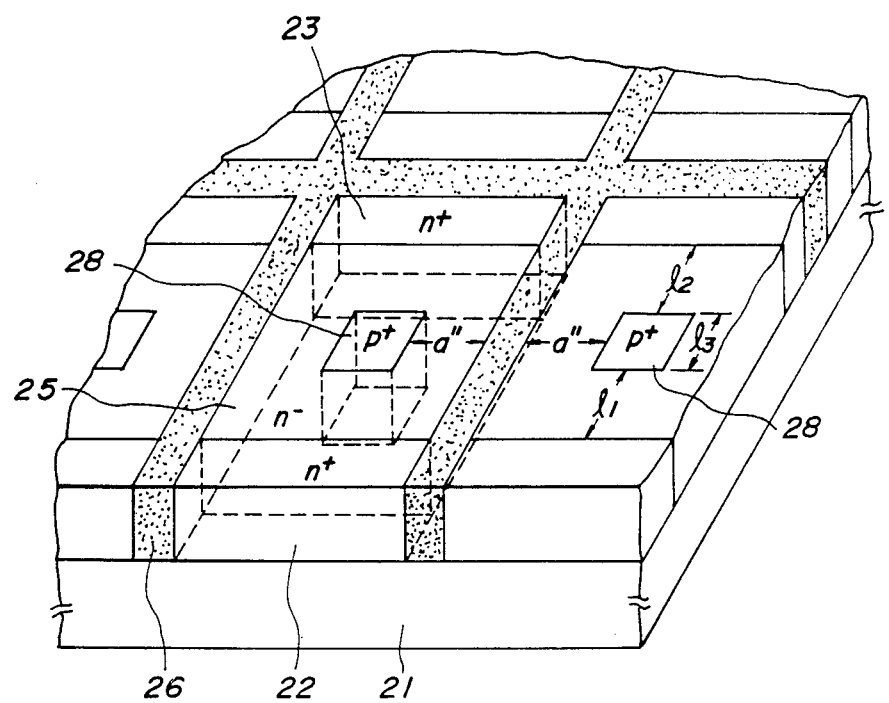
FIG_6

SEMICONDUCTOR PHOTOELECTRIC CONVERTING DEVICE

This is a continuation of application Ser. No. 946,099, filed 12-23-86, now abandoned, which is a continuation of application Ser. No. 686,847, filed 12-27-84, now abandoned.

BACKGROUND OF THE INVENTION

The present inventioon relates to a semiconductor photoelectric converting device comprising a static induction transistor (hereinafter abbreviated as SIT).

A solid state image sensor comprising a number of semiconductor photoelectric converting devices have been utilized in electronic still cameras, home video cameras, facsimile machines and so on. In the known solid state image sensor use has been widely made of a charge transfer device such as BBD, CCD, or MOS transistor devices. However, the known semiconductor image sensor using such semiconductor devices has drawbacks such as charge leakage during transportation of the signal charges, a low light detection sensitivity and a low integration density.

In order to remove all the above mentioned drawbacks there has been developed a solid state image sensor utilizing SITs. The SIT is a kind of a phototransistor having a photoelectric converting function and a photocarrier amplifying function and is superior to a field effect transistor and junction transistor in view of its high input impedance, high operation speed, non-saturation, low noise and low power consumption. Therefore, when a solid state image sensor is constructed by using SITs as photosensitive elements, it is possible to obtain a semiconductor image sensor having high sensitivity, high speed response and wide dynamic range. Such a semiconductor image sensor has been described in, for instance Japanese Patent Laid-open Publication No. 15,229/80.

FIG. 1 is a cross sectional view showing an SIT forming a pixel of the known solid state image sensor described in the above-referenced Laid-open Publication. This SIT is of the vertical type and comprises an n+ substrate 1 constituting a drain region, and an n− epitaxial layer 2 formed on the substrate 1, the epitaxial layer 2 forming a channel region. The SIT further comprises a source region 3 constructed by an n+ region 3 which is formed in the surface of epitaxial layer 2. In the surface of epitaxial layer 2, there is further formed a p+ signal storing gate region 4 which surrounds the source region 3. On the gate region 4 is formed an insulating film 5 and a gate electrode 6. In this manner, there is formed a metal-insulator-gate region construction, i.e. MIS gate construction. The n− epitaxial layer 2 forming the channel region has such a low impurity concentration such that the channel region has been depleted to form a high potential barrier and has been pinched-off thereby even though a bias voltage of zero volts is applied to the gate region 6.

Now the operational principle of the SIT will be explained hereinafter. When light input is made incident upon the channel regioon 2 and gate region 4, while a bias voltage is not applied across the drain and source, electronhole pairs are generated in the channel and gate regions, the holes are stored in the gate region 4 the electrons are flow to the earth via the drain region 1. The holes stored in the gate region 4 in response to the light input increases the potential of the gate and thus the potential barrier in the channel region 2 is decreased accordingly. When a bias is applied across the drain and source and a forward voltage is applied to the gate electrode 6, a current flows between the drain and source in accordance with the amount of holes stored in the gate region 4. In this manner, an output which is amplified with respect to the light input can be obtained. Usually the light amplification S is larger than $10^3$, and thus the SIT has a higher sensitivity than the known bipolar transistor by more than ten times. Generally the light amplification S can be represented as follows.

$$S \propto \frac{l_1 \times l_2}{a^2}$$

wherein $2a$ is an inner diameter of the gate region, $l_1$ is a depth of the gate region and $l_2$ is a distance between the gate and drain regions. As can be understood from the above equation, in order to make larger the light amplification S, it is necessary to decrease the inner diameter $2a$ as well as to increase the thickness of the epitaxial layer 2 and the depth of the gate region 4. For instance, in order to obtain the light amplifications S of $10^3$–$10^4$, it is usually necessary to satisfy such conditions that $l_1 = 2$–$3$ μm and $l_2 = 5$–$6$ μm.

In the solid state image sensor shown in FIG. 1, between adjacent SITs is formed an isolation gate region 7 for isolating the signal charges in respective SITs from one another. In general, the isolation gate region 7 is formed by oxide film, diffused region or V-shaped recess. Usually, the isolation region 7 extends from the surface of epitaxial layer 2 to the surface of substrate 1 and therefore, if the epitaxial layer 2 has a large thickness, the formation of the isolation region 7 becomes much more difficult. On the other hand, in order to obtain a higher light amplification S, it is necessary to make the gate region 4 deeper, but in practice, the gate 4 cannot be made deeper by the diffusion method. Moreover, if the gate region 4 has a larger depth, there might occur an absorption of light therein and the spectroscopic sensitivity of the image sensor becomes worse. In this manner, in the known solid state image sensor having the vertical type SITs, the sensitivity is inherently limited due to its constructional feature discussed above.

SUMMARY OF THE INVENTION

The present invention has for its object to provide a semiconductor photoelectric converting device which can obviate the above mentioned drawbacks of the known semiconductor photoelectric converting device comprising a vertical type SIT.

It is another object of the invention to provide a semiconductor photoelectric converting device comprising a lateral type SIT.

It is still another object of the invention to provide a semiconductor photoelectric converting device which has a high performance and can be manufactured easily.

According to the invention a semiconductor photoelectric converting device comprises:

a substrate having a high resistance;

a semiconductor layer of one conductivity type applied on a surface of the substrate;

a source region of one conductivity type formed in the surface of the semiconductor layer;

a drain region of one conductivity type formed in the surface of the semiconductor layer; and a gate means formed in the surface of the semiconductor layer between said source and drain regions for storing carriers generated by a light excitation; whereby a source-drain current flows in parallel with the surface of the semiconductor layer.

BRIEF DESCRIPTION OF THE DRAWINGS

FIGS. 2A and 2B are plan and cross sectional views, respectively, illustrating an embodiment of the semiconductor photoelectric converting device according to the invention;

FIGS. 3A and 3B are plan and cross sectional views, respectively, depicting another embodiment of the semiconductor photoelectric converting device according to the invention;

FIG. 5 is a perspective view showing another embodiment of the semiconductor photoelectric converting device according to the invention; and FIG. 6 is a perspective view illustrating still another embodiment of the semiconductor photoelectric converting device according to the invention.

DESCRIPTION OF THE PREFERRED EMBODIMENTS

Figure 1:
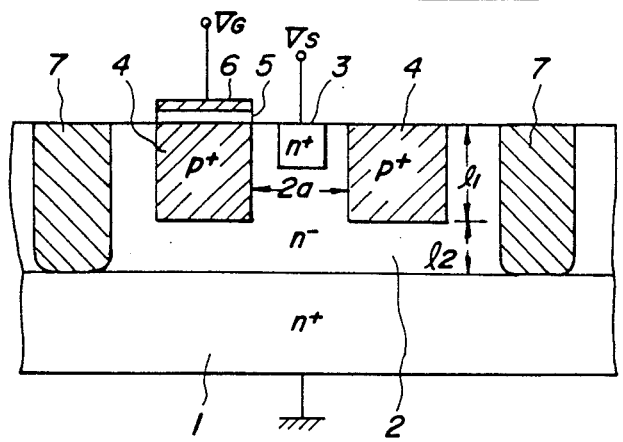
FIG. 1 is a cross sectional view showing a known semiconductor photoelectric converting device comprising a vertical type SIT.

FIG. 2A is a plan view showing an embodiment of the semiconductor photoelectric converting device according to the invention and FIG. 2B is a cross sectional view cut along a line I—I in FIG. 2A. The semiconductor photoelectric converting device of the present embodiment comprises a high resistive substrate 11 made of an insulating oxide material such as sapphire ($Al_2O_3$) and magnesia (MgO). On the substrate is formed an n$^-$ epitaxial layer 12 in a surface of which are formed, by introducing n type impurities, and n$^+$ source region 13 and an n$^+$ drain region 14.

The n$^-$ epitaxial layer 12 constitutes a current path, i.e. channel region in which is formed a p$^+$ gate region 15 by diffusing p type impurities into the surface of epitaxial layer 12. On the source and drain regions 13 and 14 are formed source and drain electrodes 16 and 17, respectively, by depositing a metal such as aluminum. On the gate region 15 is provided a gate electrode 18 made of transparent electrode material such as $SnO_2$ and ITO.

As explained above, in the present embodiment, the photoelectric converting device comprises a lateral type SIT having a gate region formed as the junction gate. Hereinafter, this type of SIT is called Junctioon Gate Lateral Transistor (JGLT). In FIGS. 2A and 2B, a reference numeral 19 denotes an isolation region which is made of semiconductor oxide or insulating material and serves to protect the surface of the device and isolate electrically each JGLT from adjacent JGLTs.

Next, the operational principle of the semiconductor photoelectric converting device comprising JGLT will be explained. Prior to the illumination, the source electrode 16 is connected to the earth and a negative voltage $V_G$ is applied to the gate electrode 18 so that the channel region between the source region 13 and drain region 14 is blocked. Thereafter, the gate potential is maintained at a floating potential and the light input is made incident upon the channel region and gate region 15. Due to the illumination, electron-hole pairs are induced in the channel region and holes are stored in the gate region 15, but electrons flow into the earth via the source region 13.

Due to the accumulation of holes, the gate potential $V_G$ becomes small in its absolute value and this results in the channel region being made conductive. Therefore, when a positive voltage $V_D$ is applied to the drain electrode 17, a current flows between the source and drain regions. A magnitude of this source-drain current passing between the source and drain regions is dependent upon the amount of holes stored in the gate region 15.

In FIG. 2B $l_1$, $l_2$, $l_3$ and t represent construction factors for determining the photoelectric converting characteristics of the semiconductor photoelectric converting device comprising JGLT. $l_1$ denotes the distance between the source and gate regions 13 and 15, $l_2$ the distance between the gate and drain regions 15 and 14, $l_3$ the width of the gate region 15 and t represents the thickness of the channel region. The maximum thickness $t_{max}$ of the channel region may be expressed as a function of an impurity concentration Cn of the n$^-$ epitaxial layer 12 in the following manner.

$$t_{max} = \sqrt{\frac{2Ks\epsilon_0}{qCn} \times \phi_B}$$

wherein Ks is a dielectric constant of the semiconductor material, $\epsilon_0$ is a dielectric constant of the vacuum and is equal to $8.86 \times 10^{-14}$ F/cm, q is an electrostatic charge amount, and $\phi_B$ is a diffusion potential between the channel region and the gate region 15. For instance, when use is made of silicon semiconductor material having the impurity concentration $Cn = 1 \times 10^{14}$ cm$^{-3}$ and $1 \times 10^{15}$ cm$^{-3}$, the maximum thickness $t_{max}$ of the channel region becomes 3 μm and 1 μm, respectively.

When the thickness t of the channel region is made larger than $t_{max}$ (t > $t_{max}$), while the potential of the gate region 15 with respect to the channel region is returned from the reverse bias condition to $\phi_B$ due to the illumination of light, there might be produced a current path outside the channel region. That is, a current might flow through an additional region (t-$t_{max}$) in the epitaxial layer which extends beyond the channel region. Therefore, in such a case these current components, i.e. the current passing through the channel region and that passing through the additional region should be separated from each other by any means.

The factors $l_1$, $l_2$ and $l_3$ relate to the voltage amplification S which can be expressed experimentally as follows.

$$S \propto \frac{(l_1 + l_3) \times l_2}{t^2}$$

For instance, when t = 1.2 μm, $l_1$ = 1 μm, $l_2$ = 1.2 μm and $l_3$ = 2.3 μm, the voltage amplification S of JGLT is equal to about 2.5.

FIGS. 3A and 3B illustrate another embodiment of the semiconductor photoelectric converting device according to the invention. FIG. 3B is a cross sectional view cut along a line II—II in FIG. 3A. In the present embodiment the gate region of the lateral SIT is formed as an insulated gate region. The semiconductor photoelectric converting device according to this embodiment comprises an insulating substrate 11, an n⁻ epitaxial layer 12 is formed on the substrate 11, source and drain regions 13 and 14 formed by diffusion n type impurities into the surface of epitaxial layer 12 and a gate region 20 formed between an insulating film and the surface of the epitaxial layer 12. The insulating film forming the gate region 20 is formed by oxide or nitride of the epitaxial layer 12 and has a thickness of about 200 to 1,000 Å. The lateral type SIT thus formed is called Insulation Gate Lateral Transistor (IGLT).

Figure 4:
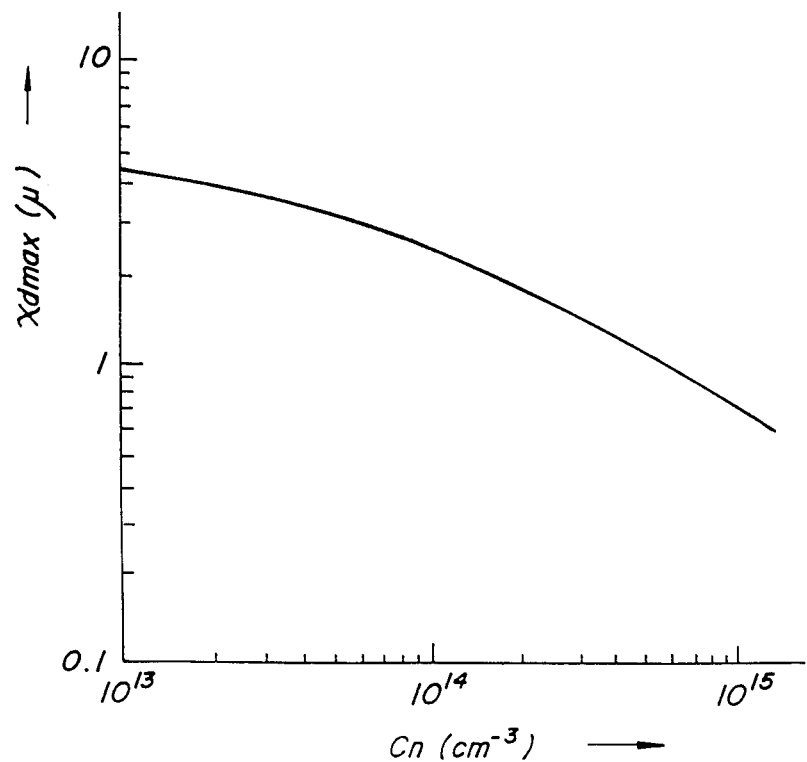
FIG. 4 is a graph representing the relationship between impurity concentration and maximum depth of a depletion layer in the lateral type SIT.

When the impurity concentration of the epitaxial layer 12 is represented by Cn, a thickness t' of the channel region has to be made smaller than the maximum thickness $\chi_{d\,max}$ of a depletion layer under the existence of an inverse layer at the impurity concentration Cn. The maximum thickness $\chi_{d\,max}$ may be expressed by the following equation.

$$\chi_{d\,max} = \sqrt{\frac{2Ks\epsilon_0(2\phi_F)}{qCn}}$$

wherein $\phi_F$ is a Fermi potential. If the thickness t' is larger than $\chi_{d\,max}$, the gate controlling operation for the source-drain current might be incomplete. For instance, when use is made of the silicon epitaxial layer 12, the insulating film forming the gate region 20 has a thickness of 1,000 Å and a fixed charge Qss at an interface between the insulating film and silicon epitaxial layer is zero, the relationship between $\chi_{d\,max}$ and the impurity concentration Cn of the channel region may be expressed by a curve shown in FIG. 4. As can be read from the graph, when use is made of the epitaxial layer having the impurity concentration $Cn = 1 \times 10^{-}cm^{-3}$, the thickness t' of the channel region has to be made smaller than 2.4 μm.

Since a distance L between the source and drain regions corresponds to $l_1 + l_2 + l_3$ of JGLT shown in FIG. 2B, when $Cn = 1 \times 10^{14}$ cm⁻³, t' = 1.2 μm and L = 4.5 μm, there can be obtained the IGLT having a voltage amplification S of about 2.5.

Now the photoelectric converting operation of IGLT will be explained. In a dark condition, to the source (drain) electrode 16 and drain (source) electrode 17 are applied source and drain voltages $V_S = 0$ and $V_D = 0$, respectively, and to the gate electrode 18 is applied a gate voltage $V_G = V$ (V < 0). Due to the negative gate voltage $V_G$, a depletion layer extends all over the channel region from the interface between the insulating film and the epitaxial layer 12. This condition is an astable one and therefore, holes cannot exist in the depletion layer. When the light input is made incident upon the depletion layer, hole-electron pairs are generated therein. Holes are stored in the interface between the insulating film and the channel region 12. Then a height of a barrier potential between the source and drain regions is decreased by an amount corresponding to an amount of holes stored in the interface.

After a given hole accumulating time, when the positive voltage is applied to the drain electrode 17, a source-drain current $I_{SD}$ flows in accordance with the amount of holes stored in said interface. The current $I_{SD}$ is increased as compared with the case in which no light input is given and no holes are stored in the interface and therefore, the amount of the light input can be derived as the source-drain current $I_{SD}$.

In the embodiments so far explained, the channel region is formed immediately below the gate region and the channel current is controlled by the potential distribution extending downward from the gate region to the substrate. According to the invention, it is also possible to control the channel current by means of a potential distribution which extends laterally from the side of the gate region. Such an embodiment will be explained with reference to FIGS. 5 and 6.

FIG. 5 is a perspective view showing another embodiment of the semiconductor photoelectric converting device according to the invention. The device comprises an insulating substrate 21, an n⁻ epitaxial layer 25 formed on the substrate 21, and source and drain regions 22 and 23 formed by diffusing n type impurities into the surface of epitaxial layer 25. In the present embodiment, there are formed two gate regions 24 and 24 separated from each other in the lateral direction. As shown in FIG. 5, the gate regions 24 and 24 are formed in such a manner that their bottom surfaces are in contact with the surface of substrate 21. The device further comprises an isolating region 26 formed by an insulating material.

In the construction explained above, since no current can flow below the gate regions 24 and 24 the source-drain current passes between the gate regions 24 and 24 in parallel with the surface of epitaxial layer 25. Also in the present embodiment, the source-drain current is controlled by the gate potential in a similar manner to that explained above with reference to FIG. 2B.

FIG. 6 is a perspective view illustrating still another embodiment of the semiconductor photoelectric converting device according to the invention similar to that shown in FIG. 5. In the present embodiment, there is formed only one gate region 28 which extends up to the surface of substrate 21. In this embodiment, the source-drain current flows between the gate region 28 and side walls of the isolation region 26 in parallel with the surface of epitaxial layer 25.

In the embodiments shown in FIGS. 5 and 6, the construction factors $l_1$, $l_2$ and $l_3$ are the same as those shown in FIG. 2B, but the thickness t of channel region in FIG. 2B corresponds to a distance a' between the two gate regions 24 and 24 in FIG. 5 and to a distance a" between the gate region 28 and the side wall of isolation region 26 in FIG. 6. It should be noted that the distances a' and a" can be determined at will photolithographically without regard to the thickness of epitaxial layer 25 and the diffusion depth of the gate region. Therefore, in the embodiments shown in FIGS. 5 and 6 there is not produced any variation in characteristics due to possible variation in the thickness of the epitaxial layer and the diffusion depth of the gate region as compared with the embodiments shown in FIGS. 2 and 3. In other words, the characteristics of the devices shown in FIGS. 5 and 6 are hardly affected by process factors.

In the above embodiments, the substrate is formed by the insulating material, but may be made of intrinsic, p⁻ semiconductor material having a high resistance for inhibiting the current passage. Particularly, when the substrate is formed by p⁻ semiconductor material having an opposite conductivity type to that of the epitaxial layer, it is possible to apply a bias voltage to the channel region via the substrate. In such a case, the channel current can be controlled from both the surface gate and the rear substrate and thus desired photoelectric converting characteristics can be obtained by suitably setting the substrate bias.

In the above embodiments, the channel region is of the n type in which electrons flow as carriers, but the channel region may be formed as p channel. In such a case, the conductivity types of the remaining regions should be reversed and the polarities of the bias voltages have to be inverted.

Further, there may be used semiconductor single element of IV or V groups or III–V or II–VI compound semiconductor material. Moreover, use may be made of an amorphous of these materials.

As explained above in detail, according to the invention since the photoelectric converting device is formed by the lateral type SIT, it is possible to attain not only the photoelectric converting function, but also the amplifying function and therefore, it is possible to obtain a high S/N as compared with a MOS transistor and a CCD which do not have a amplifying function.

Moreover, since the SIT is designed to have a non-saturation property, there can be obtained such advantages as high operation speed, low noise, low power consumption and high input impedance. Therefore, the photoelectric converting device according to the invention has superior properties such as high sensitivity, high response speed and wide dynamic range.

Further, according to the invention, since use is made of the lateral type SIT, the requirements for dimensions are less strict as compared with the vertical type SIT and therefore, the light amplification and sensitivity can be improved easily. When circumferential devices are formed by MOS transistors, the lateral SIT can be manufactured by the common MOS process together with MOS transistors. Moreover, the freedom of arrangement of the terminals of the lateral type SIT is much greater than that of the vertical SIT.

Further, in the semiconductor photoelectric converting device according to the invention, the device size can be easily minimized and thus the integration can be attained advantageously. Particularly, a three dimensional integrated device may be realized.

What is claimed is:

1. In a semiconductor photoelectric converting device including a lateral static induction transistor, said lateral static induction transistor comprising:
    a substrate having a high resistance;
    a semiconductor layer of a first conductivity type applied on a surface of said substrate, said semiconductor layer having a surface;
    a source region of said first conductivity type formed in the surface of said semiconductor layer;
    a drain region of said first conductivity type formed in the surface of said semiconductor layer; and
    gate means, formed in the surface of said semiconductor layer between said source and drain regions, for storing photocarriers generated by a light excitation, and for controlling a source-drain current flowing in parallel with the surface of said semiconductor layer, a magnitude of said source-drain current being substantially proportional to an amount of said stored photocarriers multiplied by an amplification factor.

2. In a device according to claim 1, wherein said gate means comprises a gate region of a second conductivity type formed in the surface of said semiconductor layer and a gate electrode connected to said gate region.

3. In a device according to claim 1, wherein said gate means comprises an insulating film formed on the surface of said semiconductor layer and a gate electrode applied on the insulating film.

4. In a device according to claim 1, wherein said lateral static induction transistor further comprises an isolation region formed in the surface of said semiconductor layer and surrounding said source and drain regions and said gate means, and wherein said gate means comprises a gate region extending from the surface of said semiconductor layer to the surface of said substrate and a gate electrode connected to the gate region, whereby the source-drain current flows between the gate region and the isolation region.

5. In a device according to claim 1, wherein said gate means comprises a plurality of gate regions each extending from the surface of said semiconductor layer to the surface of said substrate and a plurality of gate electrodes connected to the gate regions, whereby the source-drain current flows between adjacent gate regions.

6. In a device according to claim 1, wherein said semiconductor layer is formed by an epitaxial layer formed on the substrate.

7. In a device according to claim 1, wherein said substrate is formed by an insulating material.

8. In a device according to claim 1, wherein said substrate is formed by an intrinsic semiconductor material.

9. In a device according to claim 1, wherein said substrate is formed by a high resistive semiconductor material of a second conductivity type.

10. In a device according to claim 3, wherein said insulating film is formed by an oxide of the semiconductor layer.

11. In a device according to claim 3, wherein said insulating film is formed by a nitride of the semiconductor layer.

* * * * *